(12) United States Patent
Lee et al.

(10) Patent No.: US 9,278,491 B2
(45) Date of Patent: Mar. 8, 2016

(54) LIGHT EMITTING UNIT, BACKLIGHT ASSEMBLY INCLUDING THE SAME, AND METHOD OF MANUFACTURING THE SAME

(75) Inventors: Young-keun Lee, Cheonan-si (KR); Chan-Jae Park, Busan (KR); Sang-Chul Byun, Anyang-si (KR); Myeong-Ju Shin, Seoul (KR); Suchang Ryu, Cheonan-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 489 days.

(21) Appl. No.: 13/351,422

(22) Filed: Jan. 17, 2012

(65) Prior Publication Data

US 2013/0033892 A1 Feb. 7, 2013

(30) Foreign Application Priority Data

Aug. 2, 2011 (KR) ........................ 10-2011-0076934

(51) Int. Cl.
| | |
|---|---|
| *F21V 5/04* | (2006.01) |
| *B29D 11/00* | (2006.01) |
| *F21V 8/00* | (2006.01) |
| *G02B 19/00* | (2006.01) |
| *B29L 11/00* | (2006.01) |
| *B29C 45/14* | (2006.01) |

(52) U.S. Cl.
CPC .......... *B29D 11/00807* (2013.01); *G02B 6/003* (2013.01); *G02B 19/0014* (2013.01); *G02B 19/0047* (2013.01); *B29C 45/14655* (2013.01); *B29L 2011/0016* (2013.01); *G02B 6/0068* (2013.01); *G02B 6/0073* (2013.01); *H01L 2224/48091* (2013.01); *H01L 2224/48247* (2013.01); *H01L 2924/3025* (2013.01)

(58) Field of Classification Search
USPC .......................................... 362/602
See application file for complete search history.

(56) References Cited

U.S. PATENT DOCUMENTS

| | | | | |
|---|---|---|---|---|
| 7,190,003 | B2 * | 3/2007 | Isoda ..................... | H01L 33/54 |
| | | | | 362/362 |
| 7,614,774 | B2 * | 11/2009 | Ho et al. ....................... | 362/612 |
| 7,789,548 | B2 * | 9/2010 | Chao et al. ..................... | 362/619 |
| 7,950,825 | B2 * | 5/2011 | Cheng et al. .................. | 362/237 |
| 7,988,328 | B2 * | 8/2011 | Cheng et al. .................. | 362/237 |
| 7,988,334 | B2 * | 8/2011 | Cheng et al. .................. | 362/268 |
| 8,016,459 | B2 * | 9/2011 | Cheng et al. .............. | 362/311.02 |
| 8,047,699 | B2 * | 11/2011 | Cheng et al. .................. | 362/619 |
| 8,262,272 | B2 * | 9/2012 | Cheng et al. .................. | 362/610 |
| 2005/0280016 | A1 * | 12/2005 | Mok et al. ....................... | 257/99 |
| 2008/0031010 | A1 * | 2/2008 | Kim et al. ..................... | 362/612 |
| 2009/0153974 | A1 * | 6/2009 | Sales ............................. | 359/621 |
| 2012/0153327 | A1 * | 6/2012 | Kim et al. ....................... | 257/98 |

FOREIGN PATENT DOCUMENTS

| | | |
|---|---|---|
| JP | 3158869 U | 3/2010 |
| KR | 1020080035896 A | 4/2008 |
| KR | 100831030 B1 | 5/2008 |

\* cited by examiner

*Primary Examiner* — Britt D Hanley
(74) *Attorney, Agent, or Firm* — Cantor Colburn LLP

(57) ABSTRACT

A light emitting unit may include a housing having a bottom portion parallel to an xz plane and an opened top opposite to the bottom portion, a light emitting chip on the bottom portion and generating light, and a lens which overlaps the opened top of the housing. The lens may have a convex structure with respect to the xz plane when viewed from a cross section parallel to an xy plane and a concave structure with respect to the xz plane when viewed from a cross section parallel to a yz plane.

16 Claims, 15 Drawing Sheets

LIGHT EMITTING UNIT, BACKLIGHT ASSEMBLY INCLUDING THE SAME, AND METHOD OF MANUFACTURING THE SAME

This application claims priority to Korean Patent Application No. 10-2011-0076934, filed on Aug. 2, 2011, and all the benefits accruing therefrom under 35 U.S.C. §119, the entirety of which is incorporated by reference herein.

BACKGROUND OF THE INVENTION (1) Field of the Invention

The invention disclosed herein relates to light emitting units, backlight assemblies including the same, and methods of manufacturing the same and, more particularly, to light emitting units used in display devices, backlight assemblies including the same, and methods of manufacturing the same.

(2) Description of the Related Art

Generally, a display device may include a display panel, a backlight unit providing light to the display panel, and a chassis fixing the display panel and the backlight unit. The backlight unit may include a light emitting unit generating light, and a light guide plate guiding the light generated from the light emitting unit to the display panel. The light emitting unit may be generally provided in a plural number, and the plurality of the light emitting units may provide the light to the light guide plate. Various researches have been conducted for improving performance of the light irradiated to the light guide plate.

BRIEF SUMMARY OF THE INVENTION

Embodiments of the invention may provide light emitting units with improved light performance Embodiments of the invention may also provide backlight assemblies including light emitting units with improved light performance.

Embodiments of the invention may also provide methods of manufacturing light emitting units with improved light performance.

According to exemplary embodiments of the invention, a light emitting unit may include: a housing including a bottom portion parallel to an xz plane and an opened top opposite to the bottom portion; a light emitting chip which is disposed on the bottom portion and generates light; and a lens which overlaps the opened top of the housing. The lens has a convex structure with respect to the xz plane when viewed from a cross section parallel to an xy plane and a concave structure with respect to the xz plane when viewed from a cross section parallel to a yz plane.

In some embodiments, the light passing through the lens may have a first beam-spread angle in a plane parallel to the xy plane and a second beam-spread angle in a plane parallel to the yz plane. The second beam-spread angle is less than the first beam-spread angle.

In other embodiments, the lens may further include a plurality of convex structures, and the plurality of convex structures may be in the cross section parallel to the xy plane.

In still other embodiments, the first beam-spread angle may range from about 120 degrees to about 150 degrees, and the second beam-spread may range from about degrees 90 to about 100 degrees.

In yet other embodiments, the housing may further include sidewalls which protrude from edges of the bottom portion.

In yet still other embodiments, each of the sidewalls may have a width which narrows from the bottom portion toward a top of each of the sidewalls, and each of the sidewalls may have an inner wall which is inclined with respect to the bottom portion and faces the light emitting chip.

In further embodiments, each of the sidewalls may have an inner wall which is substantially perpendicular to the bottom portion and faces the light emitting chip.

In still further embodiments, the housing may further include an inner space between the sidewalls and the opened top. The light emitting chip is in the inner space, and the lens contacts the sidewalls and extends beyond the opened top of the inner space of the housing.

In even further embodiments, the light emitting unit may further include: a first electrode disposed on the bottom portion; a second electrode disposed on the bottom portion and spaced apart from the first electrode; and a connection wire which connects the light emitting chip to each of the first and second electrodes.

In yet further embodiments, the light emitting unit may further include: a fluorescence portion which overlaps the light emitting chip and the connection wire. The fluorescence portion may change a wavelength of the light generated from the light emitting chip.

In yet further embodiments, the light emitting unit may further include: a fluorescence portion on a top surface of the light emitting chip. The fluorescence portion may have a planar area which is smaller size than that of the top surface of the light emitting chip. The fluorescence portion may change a wavelength of the light generated from the light emitting chip.

In yet further embodiments, the lens may include silicon resin.

According to exemplary embodiments of the invention, a backlight assembly may include: a supporting unit extending in an x-axis direction and having a plate-like shape; a plurality of light emitting units disposed on the supporting unit and spaced apart from each other in the x-axis direction, the plurality of light emitting units emitting light in a y-axis direction; and a light guide plate spaced apart from the plurality of light emitting units in the y-axis direction. Each of the light emitting units may include: a light emitting chip disposed on the supporting unit; and a lens disposed on the light emitting chip. The lens has a convex structure with respect to an xz plane when viewed from a cross section parallel to an xy plane and a concave structure with respect to the xz plane when viewed from a cross section parallel to a yz plane.

In some embodiments, the light passing through the lens may have a first beam-spread angle in a plane parallel to the xy plane and a second beam-spread angle in a plane parallel to the yz plane. The second beam-spread angle is less than the first beam-spread angle.

In other embodiments, the light guide plate may include an incident surface which faces the plurality of light emitting units. The incident surface may have a long side direction parallel to the x-axis direction and a thickness direction parallel to a z-axis direction.

In still other embodiments, the first beam-spread angle may range from about 120 degrees to about 150 degrees, and the second beam-spread may range from about degrees 90 to about 100 degrees.

According to exemplary embodiments of the invention, a method of manufacturing a light emitting unit may include: preparing a unit structure in which a light emitting chip electrically connected to first and second electrodes, and a fluorescence portion, are formed; disposing the unit structure in a molding structure; injecting a lens material compound into a space between the molding structure and the unit structure; and hardening the lens material compound to complete a lens.

The lens may have a convex structure with respect to an xz plane when viewed from a cross section parallel to an xy plane and a concave structure with respect to the xz plane when viewed from a cross section parallel to a yz plane.

In some embodiments, the method may further include: removing the molding structure from the lens.

In other embodiments, the method may further include disposing a plurality of unit structures in the molding structure.

BRIEF DESCRIPTION OF THE DRAWINGS

The invention will become more apparent in view of the attached drawings and accompanying detailed description.

DETAILED DESCRIPTION OF THE INVENTION

Figure 1:
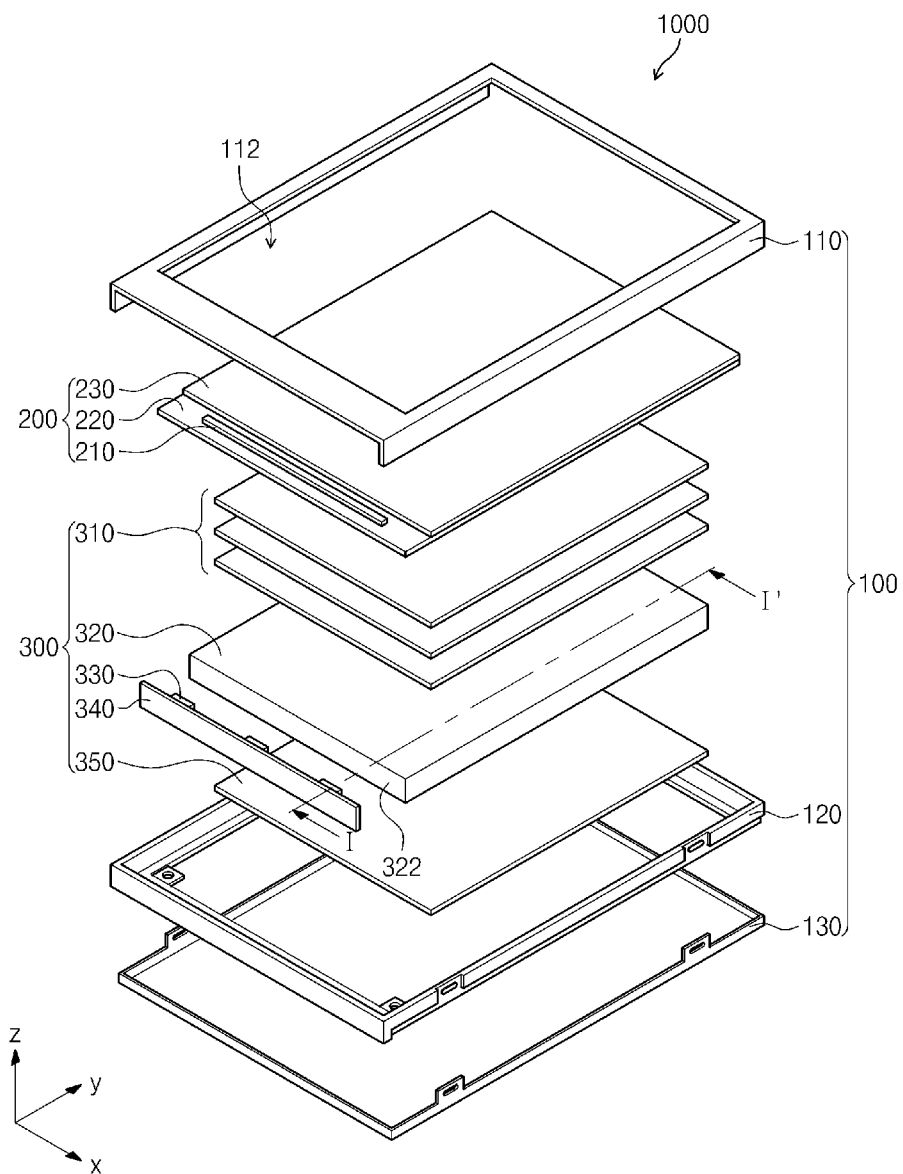
FIG. 1 is an exploded perspective view illustrating an exemplary embodiment of a display device according to the invention.

The invention will now be described more fully hereinafter with reference to the accompanying drawings, in which exemplary embodiments of the invention are shown. The advantages and features of the invention and methods of achieving them will be apparent from the following exemplary embodiments that will be described in more detail with reference to the accompanying drawings. It should be noted, however, that the invention is not limited to the following exemplary embodiments, and may be implemented in various forms. Accordingly, the exemplary embodiments are provided only to disclose the invention and let those skilled in the art know the category of the invention. In the drawings, embodiments of the invention concept are not limited to the specific exemplary embodiments provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present. As used herein, connected may refer to elements being physically and/or electrically connected to each other.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof Additionally, the embodiment in the detailed description will be described with sectional views as ideal exemplary views of the invention. Accordingly, shapes of the exemplary views may be modified according to manufacturing techniques and/or allowable errors. Therefore, the embodiments of the invention are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the invention.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the invention.

Exemplary embodiments of aspects of the invention explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of exemplary embodiments.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, embodiments of the invention will be described with reference to drawings in more detail.

Figure 2:
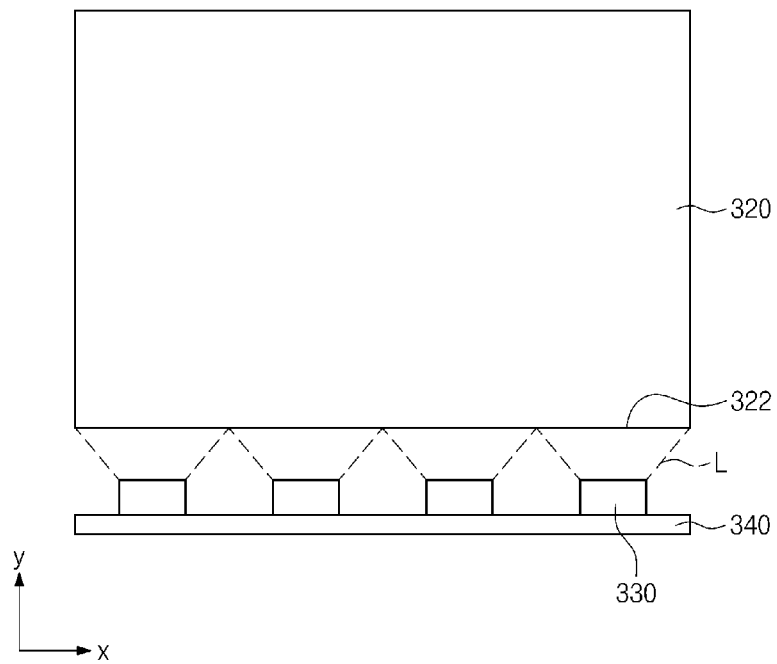
FIG. 2 is a plan view illustrating an exemplary embodiment of a backlight assembly according to the invention.
Figure 3:
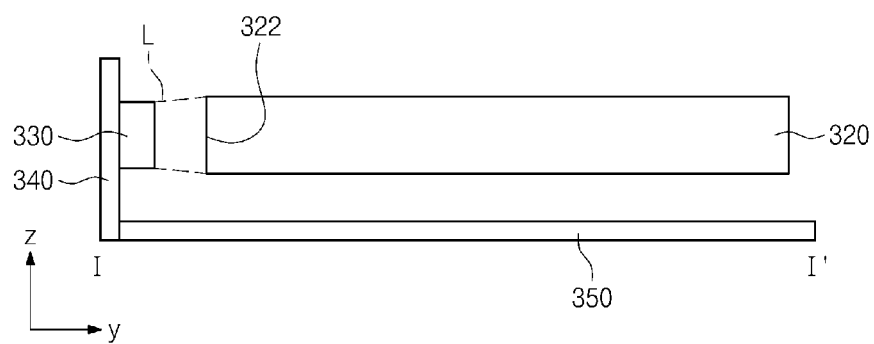
FIG. 3 is a cross sectional view illustrating the backlight assembly taken along line I-I of FIG. 1 according to the invention.

FIG. 1 is an exploded perspective view illustrating an exemplary embodiment of a display device according to the invention, FIG. 2 is a plan view illustrating an exemplary embodiment of a backlight assembly according to the invention, and FIG. 3 is a cross sectional view illustrating an exemplary embodiment of a backlight assembly according to the invention. FIG. 2 is a top plan view of the backlight assembly of the display device in FIG. 1 when viewed from a plan view, and FIG. 3 is a cross sectional view taken along line I-I' of FIG. 1.

An x-axis direction, a y-axis direction, and a z-axis direction are perpendicular to each other in the following explanation. Additionally, a plane defined by the x-axis and the y-axis is referred to as 'a xy plane', a plane defined by the y-axis and z-axis is referred to as 'an yz plane', and a plane defined by the x-axis and the z-axis is referred to as 'an xz plane'.

Referring to FIGS. 1, 2, and 3, the display device 1000 may include a display panel 200, a backlight assembly 300, and a fixing assembly 100. The backlight assembly 300 and the display panel 200 may be sequentially stacked in the z-axis direction.

The display panel 200 displays an image. The display panel 200 has a rectangular plate-like shape having a long side and a short side. In some embodiments, the long side of the display panel 200 may extend in the y-axis direction, and the short side of the display panel 200 may extend in the x-axis direction.

The display panel 200 may include a first substrate 220, a second substrate 230 opposite to the first substrate 220, and a liquid crystal layer (not shown) disposed between the first substrate 220 and the second substrate 230.

The first substrate 220 may include a plurality of pixel electrodes being arranged in matrix form, and a plurality of thin film transistors electrically connected to the pixel electrodes in one-to-one correspondence. Each of the thin film transistors switches a driving signal applied to its corresponding pixel electrode.

The second substrate 230 may include a color filter layer which displays color, and a common electrode which is provided on the color filter layer to generate an electric field with the pixel electrode. Since the liquid crystal layer may be arranged by voltages applied to the pixel electrode and the common electrode, transmittance of the light L provided from the backlight unit 300 may be controlled.

The display device 1000 may further include a driving chip 210. The driving chip 210 may be disposed on at least a side of the first substrate 220. The driving chip 210 may apply the driving signal to a data line and a gate line. The driving chip 210 may respond to an external signal to generate the driving signal for driving the display panel 200. The external signal may be a signal provided from a main circuit substrate, and the external signal may be include an image signal, various control signals, and/or a driving voltage.

The driving chip 210 may consist of two or more chips including a data driving chip and a gate driving chip which are separated from each other. Alternatively, the driving chip 210 may consist of one chip into which the data driving chip and the gate driving chip are integrated. The driving chip 210 may be mounted on the first substrate 220 by a chip on glass ("COG") process.

The backlight assembly 300 provides the light L to the display panel 200. The backlight assembly 300 may be under the display panel 200. The backlight assembly 300 may include at least one light emitting unit 330 emitting the light L, a light guide plate 320 guiding the light L toward the display panel 200, optical sheets 310 improving efficiency of the light L, and a reflection sheet 350 for changing a proceeding direction of the light L.

In some embodiments, the light emitting unit 330 is provided in a plural number. The plurality of the light emitting units 330 may be disposed on a supporting unit 340. The supporting unit 340 may have a plate-like shape longitudinally extending in the x-axis direction. The plurality of the light emitting units 330 may be disposed on a surface of the supporting unit 340 and be spaced apart from each other in the x-axis direction. Additionally, the supporting unit 340 may be spaced apart from the light guide plate 320 in the y-axis direction. The plurality of the light emitting units 330 may be disposed between the supporting unit 340 and the light guide plate 320.

The plurality of the light emitting units 330 disposed on the supporting unit 340 may emit the light L to one surface of the light guide plate 320. The one surface of the light guide plate 320, on which the light L generated from the plurality of the light emitting units 330 is incident, is defined as an incident surface 322. The light emitting unit 330 will be described in more detail later.

The light guide plate 320 may be disposed under the display panel 200. The light guide plate 320 may include a transparent high polymer resin. The light guide plate 320 has a rectangular plate-like shape having a long side and a short side. The long side of the light guide plate 320 extends in the y-axis direction, and the short side of the light guide plate 320 extends in the x-axis direction.

In the illustrated embodiment, the backlight assembly 300 is an edge type backlight assembly. In other words, the light emitting unit 330 of the backlight assembly 300 may provide the light L to a sidewall of the light guide plate 320 under the display panel 200, and the light L may be transmitted to the display panel 200 through the light guide plate 320.

The optical sheets 310 are provided between the light guide 320 and the display panel 200. The optical sheets 310 may control the light L generated from the light emitting unit 330. The optical sheets 310 may include a diffusion sheet, a prism sheet, and a protection sheet being sequentially stacked on the light guide plate 320. The diffusion sheet performs a function to diffuse the light L. The prism sheet performs a function to focus the light diffused from the diffusion sheet in a direction perpendicular to a flat surface of the display panel 200 thereover. The light transmitted from the prism sheet is substantially vertically irradiated to the display panel 200. The protection sheet is disposed on the prism sheet. In the illustrated embodiment, the optical sheets 310 may include one diffusion sheet, one prism sheet, and one protection sheet. However, the invention is not limited thereto. In some embodiments, at least one of the diffusion sheet, the prism sheet, and the protection sheet may be provided in a plural number. In other embodiments, one of the diffusion sheet, the prism sheet, and the protection sheet may be omitted.

The reflection sheet 350 is disposed under the light guide plate 320. The reflection sheet 350 reflects a leaked light, which does not initially proceed toward the display panel 200, to change the path of the leaked light toward the display panel 200. As a result, the amount of the light L provided to the display panel 200 may be substantially increased by the reflection sheet 350.

The fixing assembly 100 includes a top chassis 110, a mold frame 120, and a bottom chassis 130.

The top chassis 110 is provided on the display panel 200 at a viewing side of the display device 1000. The top chassis 110 supports a peripheral edge of a front surface of the display panel 200, and the top chassis 110 may cover (e.g., overlap) a sidewall of the mold frame 120 and/or a sidewall of the bottom chassis 130. The top chassis 110 includes a window 112 exposing a display region of the display panel 120.

The mold frame 120 is provided along an outer edge of the display panel 200 to support the display panel 200. The mold frame 120 has substantially a rectangular loop-like shape. The mold frame 120 may be provided in single, but it should not be limited thereto. That is, the mold frame 120 may be provided in plural as required.

The bottom chassis 130 is provided below the backlight assembly 300 to receive components of the backlight assembly 300.

In the display device 100 described above, the light L emitted from the light emitting unit 330 is provided to the display panel 200 through the light guide plate 320 and the optical sheets 310. The display panel 200 may transmit or shield the light L to display an image to a front direction (e.g., the viewing side) of the display panel 200.

Figure 4:
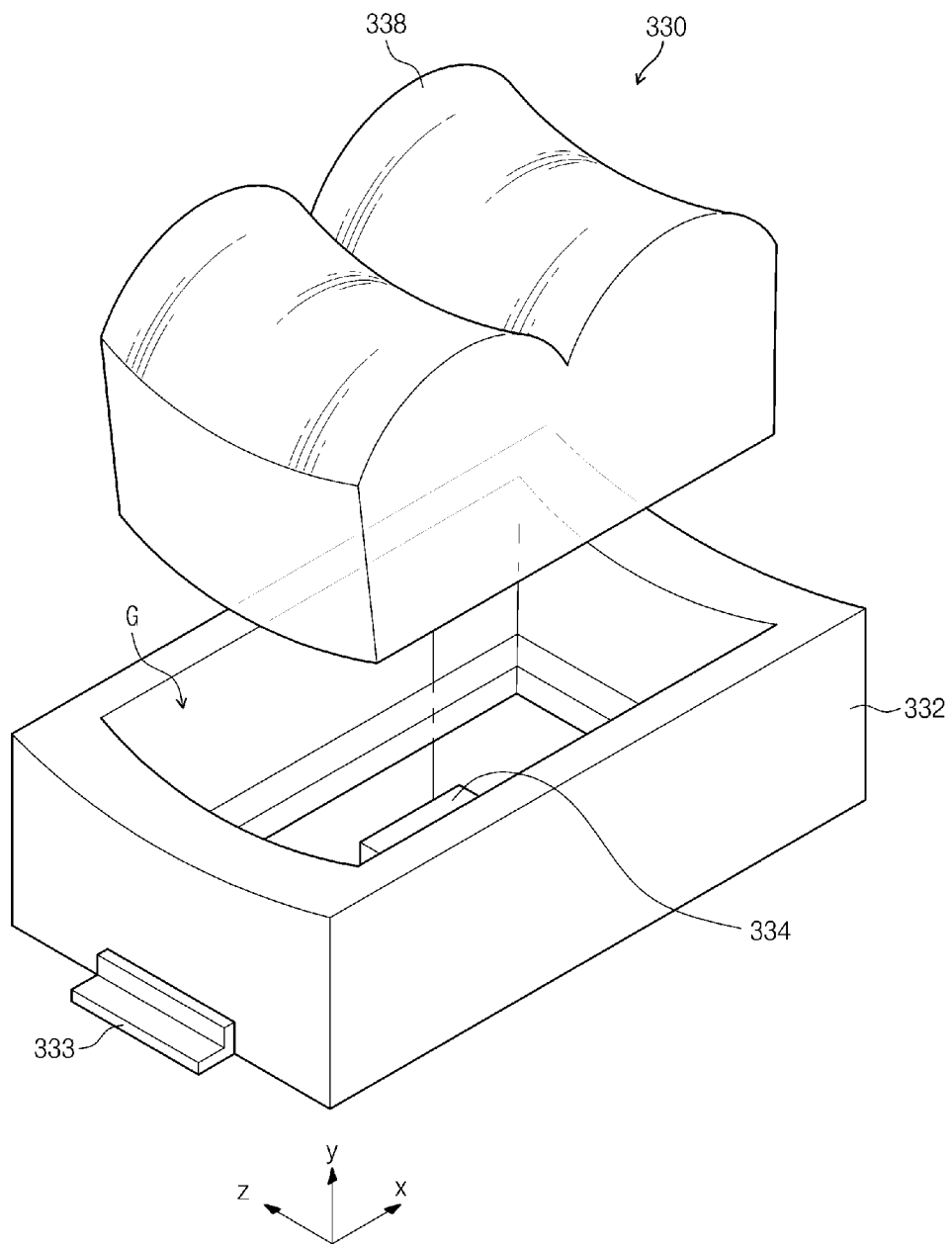
FIG. 4 is an exploded perspective view illustrating an exemplary embodiment of a light emitting unit according to the invention.
Figure 5:
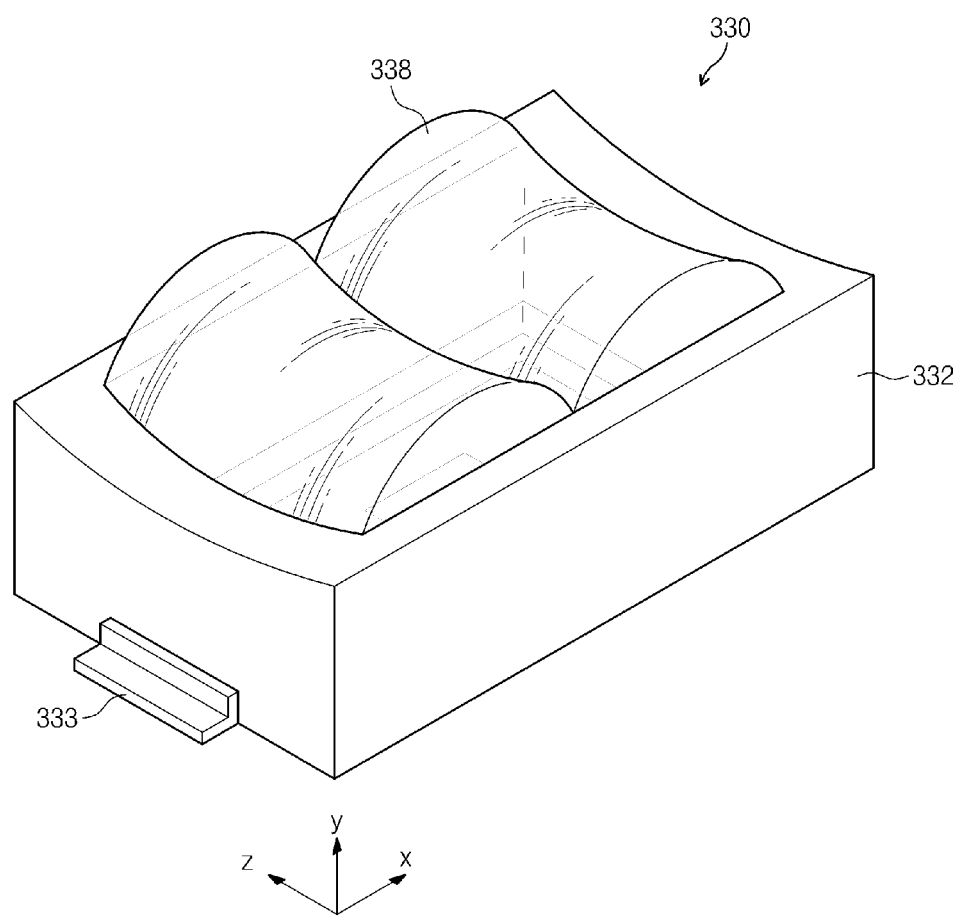
FIG. 5 is a perspective view illustrating the light emitting unit of FIG. 4 assembled, according to the invention.
Figure 6:
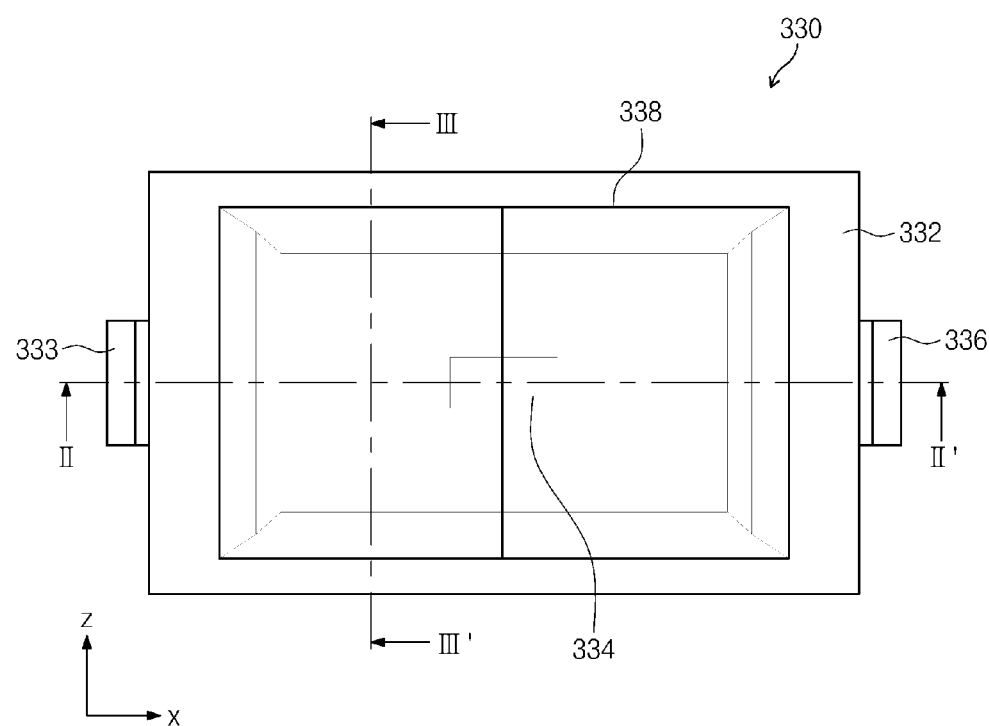
FIG. 6 is a plan view illustrating the light emitting unit of FIG. 5 according to the invention.
Figure 7:
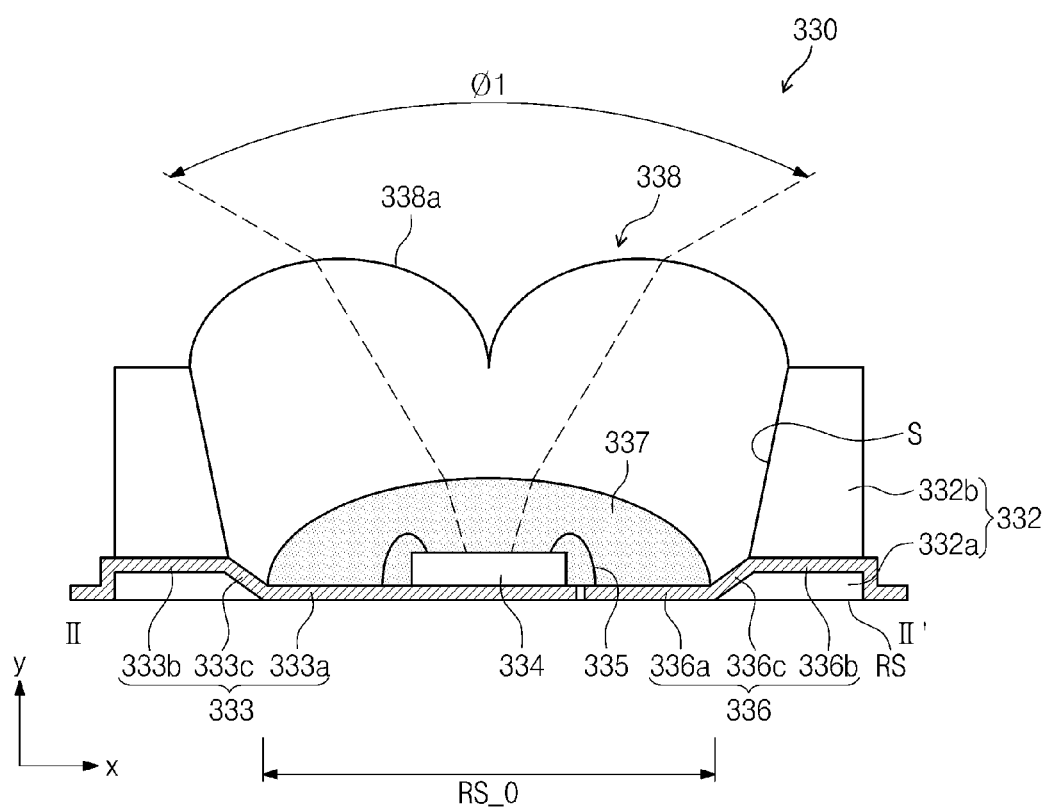
FIGS. 7 and 8 are cross sectional views illustrating the light emitting unit taken along lines II-II' and III-III' of FIG. 6, respectively, according to the invention.
Figure 8:
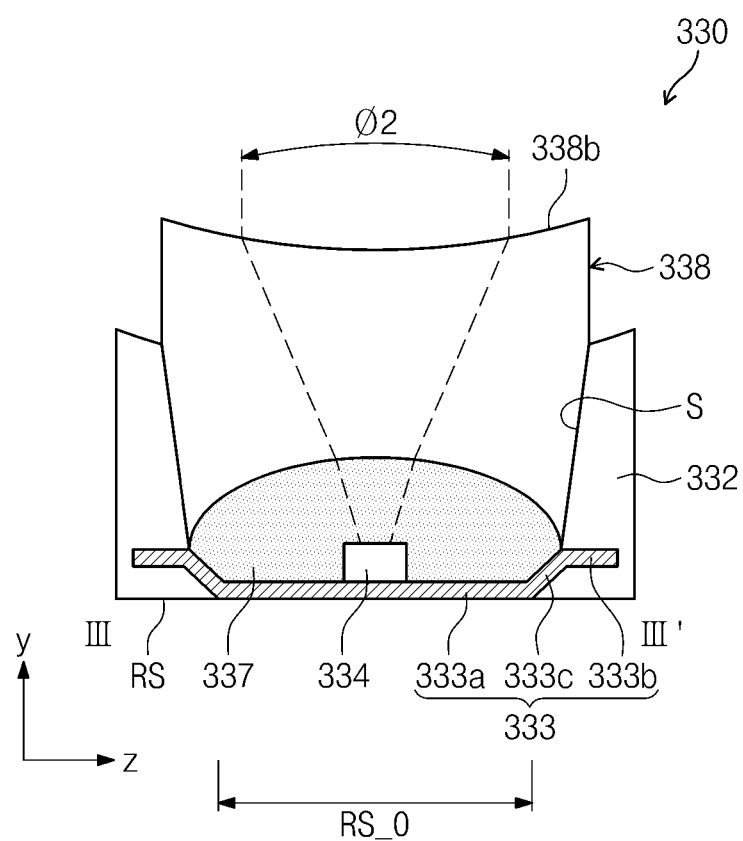

FIG. 4 is an exploded perspective view illustrating an exemplary embodiment of a light emitting unit according to the invention, FIG. 5 is a perspective view illustrating the light emitting unit of FIG. 4 assembled, according to the invention, and FIG. 6 is a plan view illustrating the light emitting unit of FIG. 5 according to the invention. FIGS. 7 and 8 are cross sectional views illustrating the light emitting unit according to the invention, FIGS. 9 and 10 are cross sectional views illustrating another exemplary embodiment of a light emitting unit according to the invention, and FIGS. 11 and 12 are cross sectional views illustrating still another exemplary embodiment of a light emitting unit according to the invention.

Figure 9:
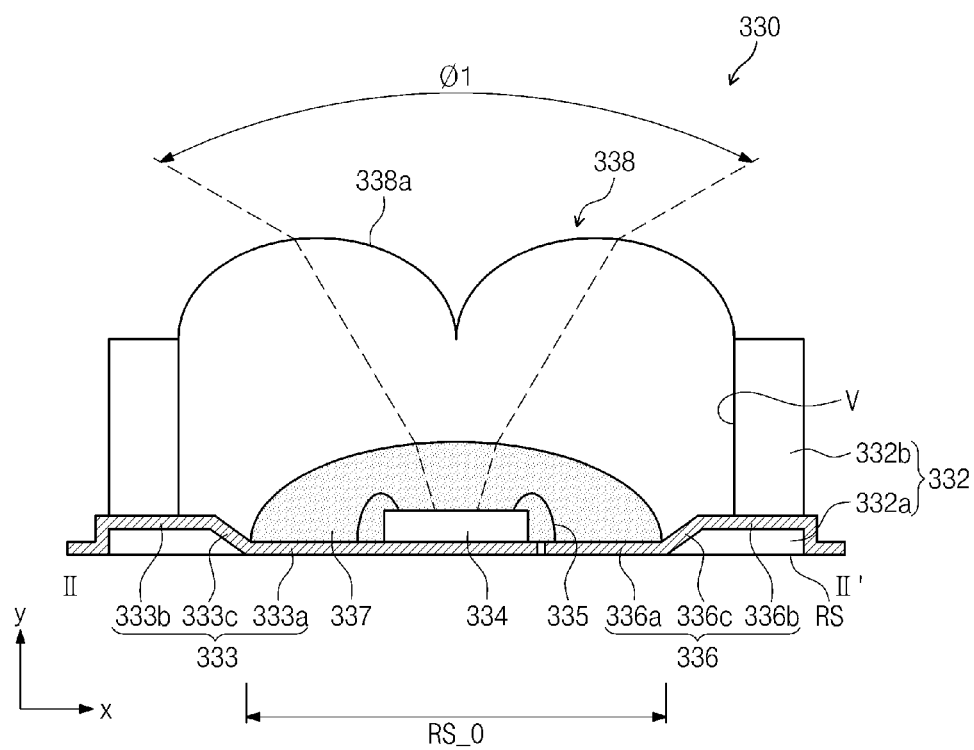
FIGS. 9 and 10 are cross sectional views illustrating another exemplary embodiment of a light emitting unit taken along lines II-II' and III-III' of FIG. 6, respectively, according to the invention.
Figure 10:
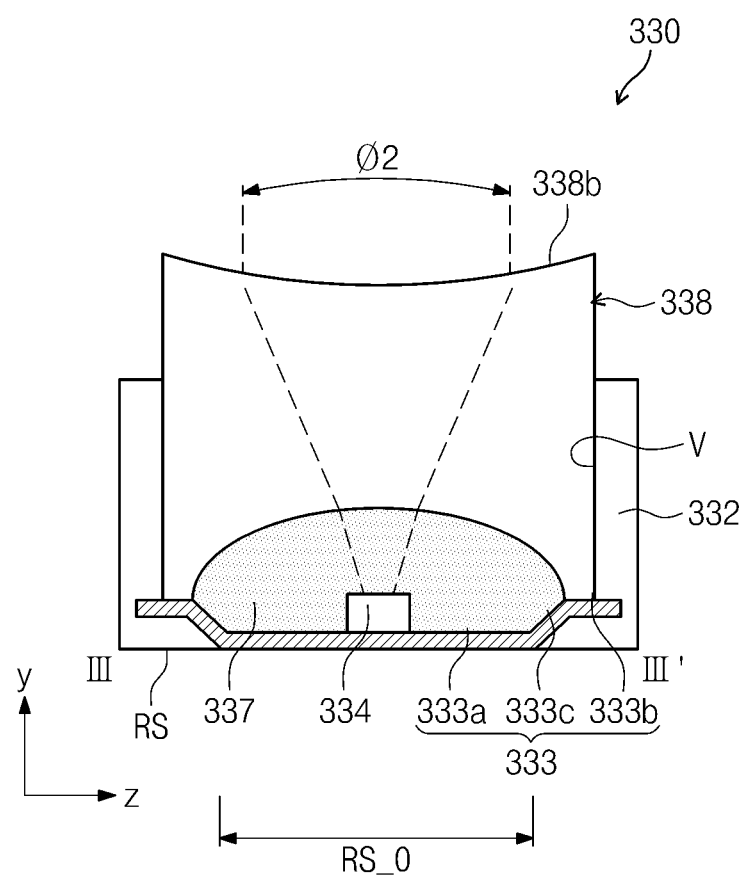
Figure 11:
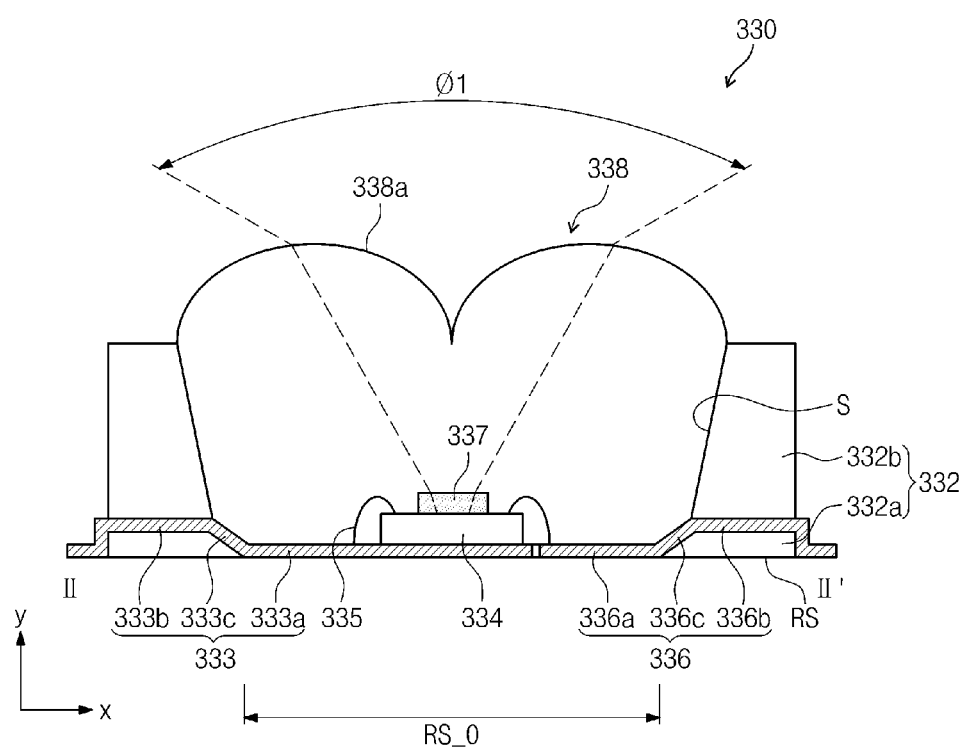
FIGS. 11 and 12 are cross sectional views illustrating still another exemplary embodiment of a light emitting unit taken along lines II-II' and III-III' of FIG. 6, respectively, according to the invention.
Figure 12:
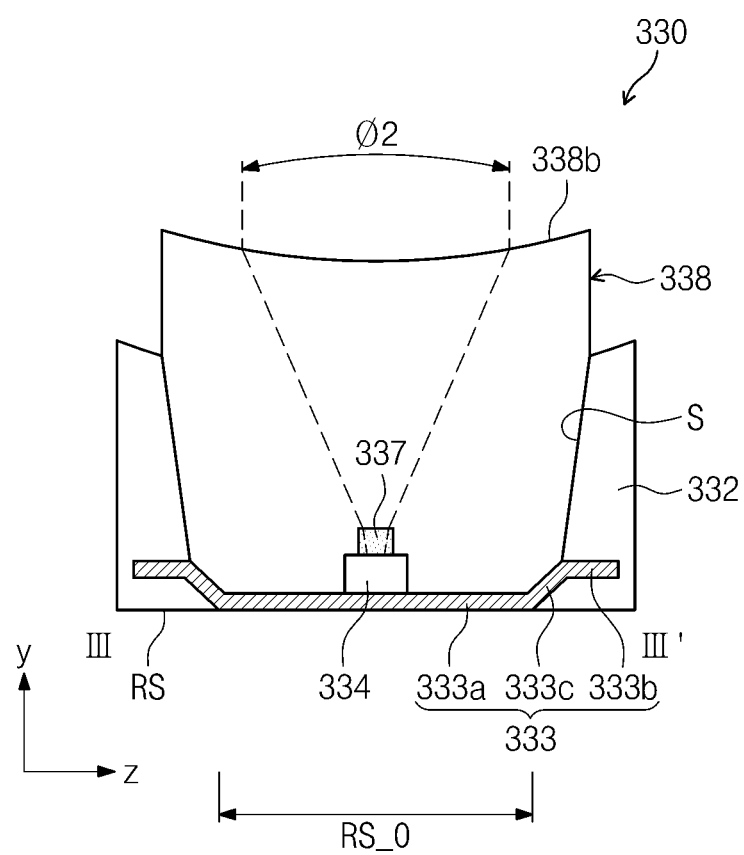

FIGS. 7, 9, and 11 are cross sectional views taken along line II-II' of

FIG. 6, and FIGS. 8, 10, and 12 are cross sectional views taken along line III-III' of FIG. 6.

The light emitting unit 330 may include a housing 332, a light emitting chip 334, a fluorescence portion 337, and a lens 338.

The housing 332 may have a substantially hexahedron-like shape and may have an opened top. The housing 332 includes a long side and a short side when viewed from the top. The long side of the housing 332 extends in the x-axis direction, and the short side of the housing 332 extends in the z-axis direction. Additionally, a height direction of the housing 332 corresponds to the y-axis direction.

The housing 332 includes a bottom portion 332a and sidewalls 332b protruded from edges of the bottom portion 332a in the height direction. The housing 332 includes an inner space G for receiving the light emitting chip 334 and the lens 338. A top of the inner space G is opened and exposed to outside of the housing 332. The housing 332 may include an insulating high polymer such as plastic. In one exemplary embodiment, for example, the housing 332 may include a material such as polyphthalamide ("PPA").

The bottom portion 332a of the housing 332 may have an opening RS_O at its center portion. The bottom portion 332a may have a quadrilateral ring-like shape in the plan view. In some embodiments, the bottom portion 332a includes a bottom surface RS, and the bottom surface RS may be a back side of the bottom portion 332a. The bottom surface RS is in the xz plane.

A first electrode 333 and a second electrode 336 may be disposed in the opening RS_O. The first electrode 333 may be inserted into one of the sidewalls 332b of the housing 332 to be combined with the housing 332, and the second electrode 336 may be inserted into another of the sidewalls 332b opposite to the one of the sidewalls 332b to be combined with the housing 332. The first electrode 333 is electrically and/or physically separated from the second electrode 336. In some embodiments, a planar area of the first electrode 333 may be substantially greater than that of the second electrode 336.

According to some embodiments, the first electrode 333 includes a first portion 333a disposed in the opening RS_O of the bottom portion 332a of the housing 332, and a second portion 333b inserted into the one of the sidewalls 332b of the housing 332. The second portion 333b may extend from the first portion 333a through a first step difference portion 333c. The second portion 333b may be disposed at a higher level than the first portion 333a with respect to the bottom surface RS of the bottom portion 332a. The first portion 333a, the second portion 333b and the first step difference portion 333c may collectively form a single, unitary, indivisible member. The second electrode 336 includes a first portion 336a disposed in the opening RS_O of the bottom portion 332a of the housing 332, and a second portion 336b inserted into the another of the sidewalls 332b of the housing 332. The second portion 336b of the second electrode 336 may extend from the first portion 336a of the second electrode 336 through a second step difference portion 336c. The second portion 336b of the second electrode 336 may be disposed at a higher level than the first portion 336a of the second electrode 336 with respect to the bottom surface RS of the bottom portion 332a. The first portion 336a, the second portion 336b and the second step difference portion 336c may collectively form a single, unitary, indivisible member. The first portions 333a and 336a of the first and second electrodes 333 and 336 may be substantially disposed in the same plane. The second portions 333b and 336b of the first and second electrodes 333 and 336 may be substantially disposed in the same plane.

Referring to FIGS. 7 and 8, in some embodiments, each of the sidewalls 332b of the housing 332 may have a width which becomes substantially wider toward a bottom of each of the sidewalls 332b. That is, each of the sidewalls 332b of the housing 332 may have a width which becomes substantially narrower toward a top of each of the sidewalls 332b. An outer wall of each of the sidewalls 332b of the housing 332 may be a vertical surface parallel with the y-axis direction, and an inner wall of each of the sidewalls 332b of the housing 332 may be an inclined surface S.

Referring to FIGS. 9 and 10, in other embodiments, each of the sidewalls 332b of the housing 332 may have a substantially uniform width from a top thereof to a bottom thereof An outer wall and an inner wall of each of the sidewalls 332b of the housing 332 may be vertical surfaces V.

The light emitting chip 334 may be a light emitting diode which emits the light L having a wavelength of a single color. The light emitting chip 334 may be disposed on the first electrode 333. The light emitting chip 334 may be electrically connected to the first electrode 333 and the second electrode 336 by connection wires 335. The first and second electrodes 333 and 336 may be connected to an external power source (not shown). The power source applies a voltage to drive the light emitting chip 334.

The fluorescence portion 337 changes the wavelength of the light L generated from the light emitting chip 334. The fluorescence portion 337 may be disposed to be adjacent to the light emitting chip 334.

Referring to FIGS. 7 through 10, the fluorescence portion 337 may have a dome-like shape covering the light emitting chip 334. Additionally, the fluorescence portion 337 may cover (e.g., overlap) the first portions 333a and 336a of the first and second electrodes 333 and 336.

Referring to FIGS. 11 and 12, in still other embodiments, the fluorescence portion 337 may be on a top surface of the light emitting chip 334 to have a hexahedron structure. The fluorescence portion 337 may have a substantially smaller size, for example, in the x-axis and z-axis directions, than the light emitting chip 334. Additionally, the fluorescence portion 337 may not be in contact with the first and second electrodes 333 and 336 and may only be disposed between the light emitting chip 334 and the lens 338.

The lens 338 covers the opened top of the housing 332. The lens 338 may include a transparent material such as silicon resin. The lens 338 may cover the opened top of the housing 332 and may fill the inner space G of the housing 332 in which the light emitting chip 334 is disposed.

The lens 338 according to embodiments of the invention may have a convex structure 338a with respect to the xz plane when viewed from a cross section parallel to the xy plane. In some embodiments, the lens 338 may include a plurality of convex structures 338a in the cross section parallel to the xy plane. In the illustrated embodiment, the lens 338 may have two convex structures 338a, but, it should not be limited thereto. Additionally, the lens 338 may have a concave structure 338b with respect to the xz plane when viewed from a cross section parallel to the yz plane. In the illustrated embodiment, the lens 338 may have one concave structure 338b, but, it should not be limited thereto.

The light L passing through the lens 338 may proceed in the y-axis direction to be irradiated to the incident surface 322 of the light guide plate 320. The light passing through the lens 338 may have a first beam-spread angle $\phi1$ in a plane parallel to the xy plane, and a second beam-spread angle $\phi2$ in a plane parallel to the yz plane. The second beam-spread angle $\phi2$ is substantially less than the first beam-spread angle $\phi1$. The first beam-spread angle $\phi1$ may have a range of about 120 degrees to about 150 degrees, and the second beam-spread angle $\phi2$ may have a range of about 90 degrees to about 100 degrees.

Since the light L passing through the lens 338 has the first beam-spread angle $\phi1$ within the range of about 120 degrees to about 150 degrees in the plane parallel to the xy plane, it is possible to suppress a hot spot generated at the incident surface 322 of the light guide plate 320. In more detail, the plurality of the light emitting units 330 are disposed on the supporting unit 340 to be spaced apart from each other in the x-axis direction, and the incident surface 322 has a long side direction parallel to the x-axis direction. The light L generated from each of the light emitting units 330 is irradiated to the incident surface 322 in the y-axis direction and has the first beam-spread angle $\phi1$ in the plane parallel to the xy plane. As illustrated in FIG. 2, since the lights L generated from each of the light emitting units 330 has the first beam-spread angle $\phi1$ being sufficiently widened in the plane parallel to the xy plane, an end of the light L irradiated from one of the light emitting units 330 to the incident surface 322 may be in contact with or overlap with an end of the light L irradiated from another light emitting unit 330 adjacent to the one of the light emitting units 330 to the incident surface 322. Thus, it is possible to suppress generation of a portion (i.e. the hot spot) of the incident surface 322 which is not irradiated by the light L.

Additionally, since the light L passing through the lens 338 has the second beam-spread angle $\phi2$ within the range of about 90 degrees to about 100 degrees in the plane parallel to the yz plane, it is possible to minimize the loss of the light L irradiated to the incident surface 322 of the light guide plate 320. Thus, the amount of the light L irradiated to the incident surface 322 may increase. In more detail, the incident surface 322 has a thickness direction parallel to the z-axis direction. The light L generated from the light emitting unit 330 is irradiated to the incident surface 322 in the y-axis direction, and has the second beam-spread angle $\phi2$ in the plane parallel to the yz plane. As illustrated in FIG. 3, since the light emitting unit 330 emits the light L having the second beam-spread angle $\phi2$ in the plane parallel to the yz plane, the light L is irradiated to the incident surface 322 in a width being substantially equal to or less than the thickness of the incident surface 322. As a result, it is possible to minimize the loss of the light L irradiated to the incident surface 322 of the light guide plate 320. Thus, the amount of the light L irradiated to the incident surface 322 may increase.

Figure 13:
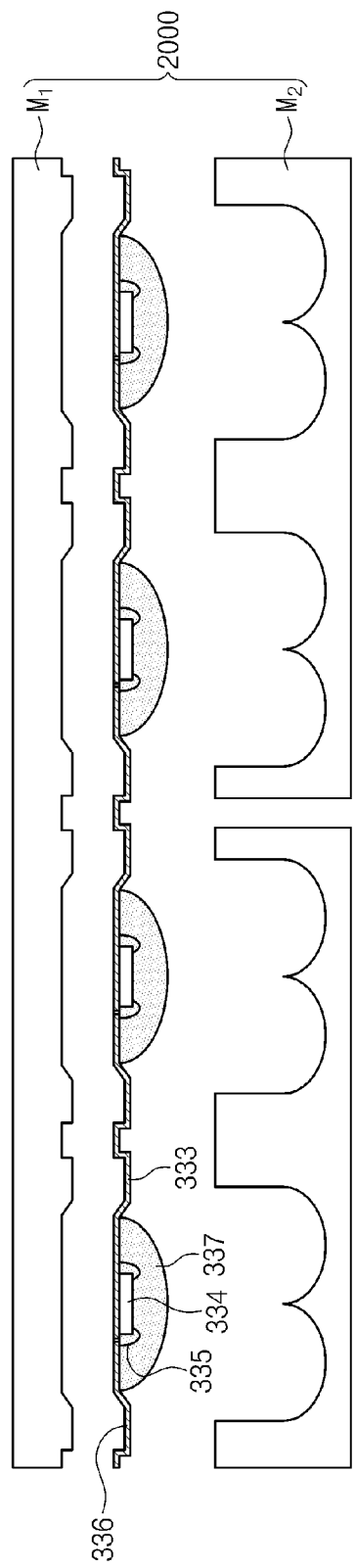
FIGS. 13 through 15 are cross sectional views illustrating an exemplary embodiment of a method of manufacturing a light emitting unit according to the invention.
Figure 14:
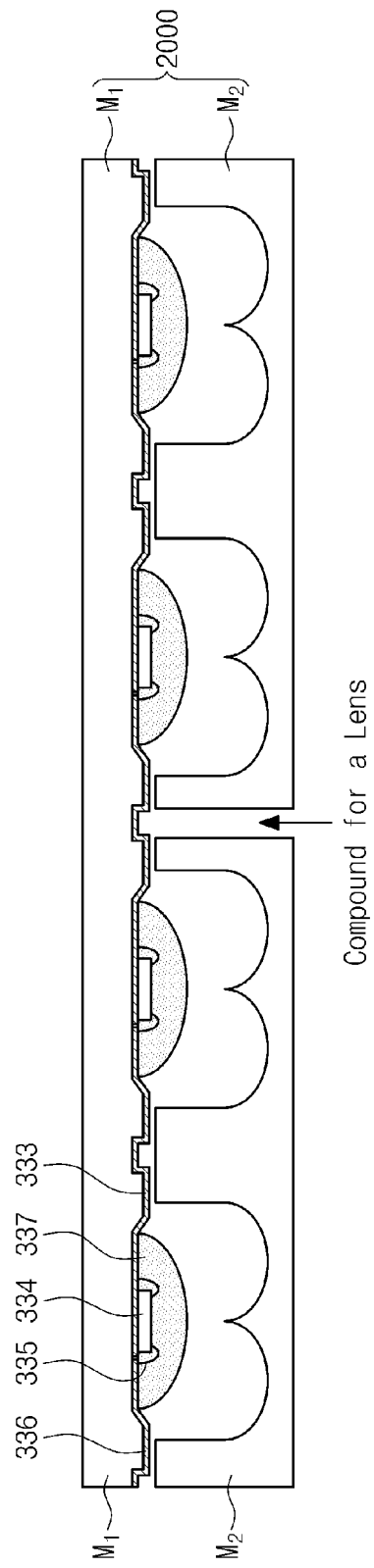
Figure 15:
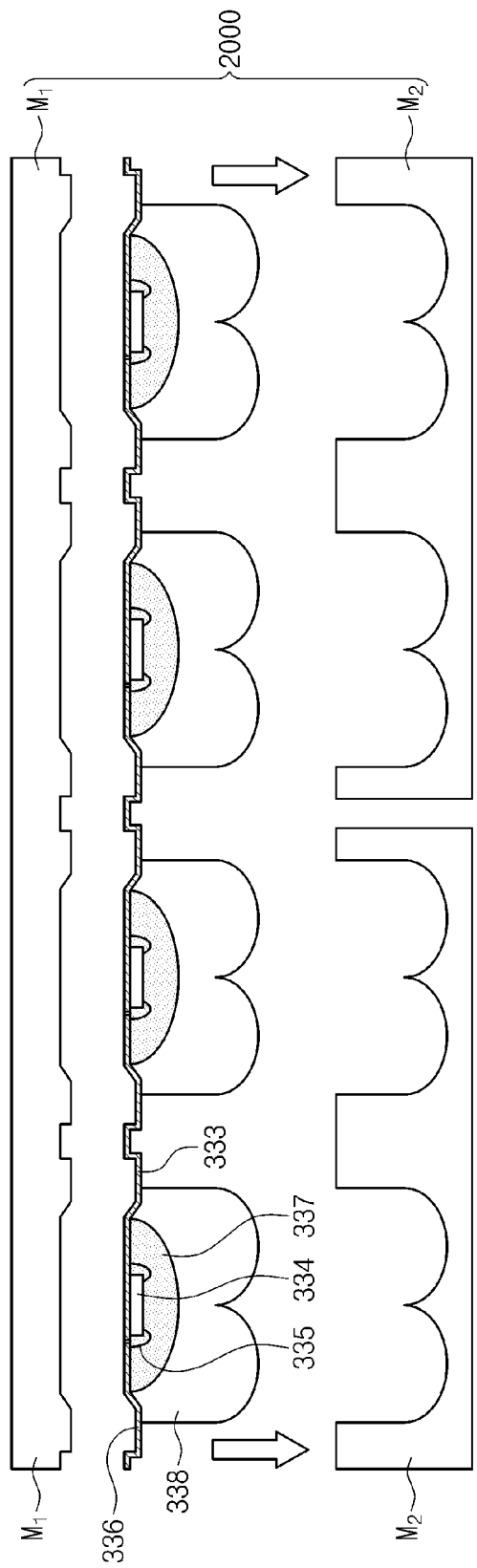

FIGS. 13 through 15 are cross sectional views illustrating an exemplary embodiment of a method of manufacturing a light emitting unit according to the invention.

Referring to FIG. 13, a unit structure, in which a light emitting chip electrically connected to first and second electrodes 333 and 336, and a fluorescence portion 337 are formed, may be disposed in a molding structure 2000.

In some embodiments, the light emitting chip 334 may be disposed on the first electrode 333, and be electrically connected to the first electrode 333 and the second electrode 336 by connection wires 335. The fluorescence portion 337 may be formed on the light emitting chip 334 which is electrically connected to the first electrode 333 and the second electrode 336 by connection wires 335. In the illustrated embodiment, the fluorescence portion 337 may have a dome-like shape partially covering the first and second electrodes 333 and 336. However, the invention is not limited to the dome-like shape of the fluorescence portion 337.

The molding structure 2000 may include a lower molding portion M1 corresponding to a back side of the first and second electrodes 333 and 336, and an upper molding portion M2 separated from the lower molding portion M1. In some embodiments, the upper molding portion M2 may have a concave region corresponding to the convex structure 338a of the lens 338 in FIGS. 4 through 12 when viewed from a cross section parallel to the xy plane. Additionally, the uppermost molding portion M2 may also have a convex region corresponding to the concave structure 338b of the lens 338 when viewed from a cross section parallel to the yz plane. In other words, the upper molding portion M2 may have a molding space corresponding to the shape of the lens 338.

In some embodiments, the unit structure including the first electrode 333, the second electrode 336, the light emitting chip 334, and the fluorescence portion 337 may be provided in a plural number. The plurality of the unit structures may be connected to each other in a horizontal direction and may be disposed in the molding structure 2000.

Referring to FIG. 14, a compound material for the lens 338 may be injected into the molding structure 2000.

In some embodiments, the compound material for the lens may include a transparent material such as silicon resin. The injected compound for the lens completely fills a space (e.g. the molding space) between the molding structure 2000 and the fluorescence portion 337. Thus, the lens 338 corresponding to the structure (e.g. the molding space) of the upper molding portion M2 of the molding structure 2000 may be formed.

Since the lens 338 is formed by a transfer molding method described with reference to FIGS. 13 and 14, the shape of the lens 338 is determined according to the structure of the molding structure 2000. Thus, the lens 338 may be formed without an additional etching process and/or an additional deposition process.

Referring to FIG. 15, the injected compound for the lens may be hardened to complete the lens 338, and the molding structure 2000 may be removed from the light emitting unit 330.

In some embodiments, when the plurality of the unit structures are connected to each other, a process cutting the unit structures may further be performed.

Thus, the light emitting unit 330 including the first electrode 333, the second electrode 336, the light emitting chip 334, the fluorescence portion 337, and the lens 338 may be completed. The structure of the lens 338 according to embodiments may be easily realized by simply changing the structure of the upper molding portion M2 of the molding structure 2000. As a result, the light emitting unit 330 with improved performance of the light L may be easily manufactured in low cost.

Figure 16:
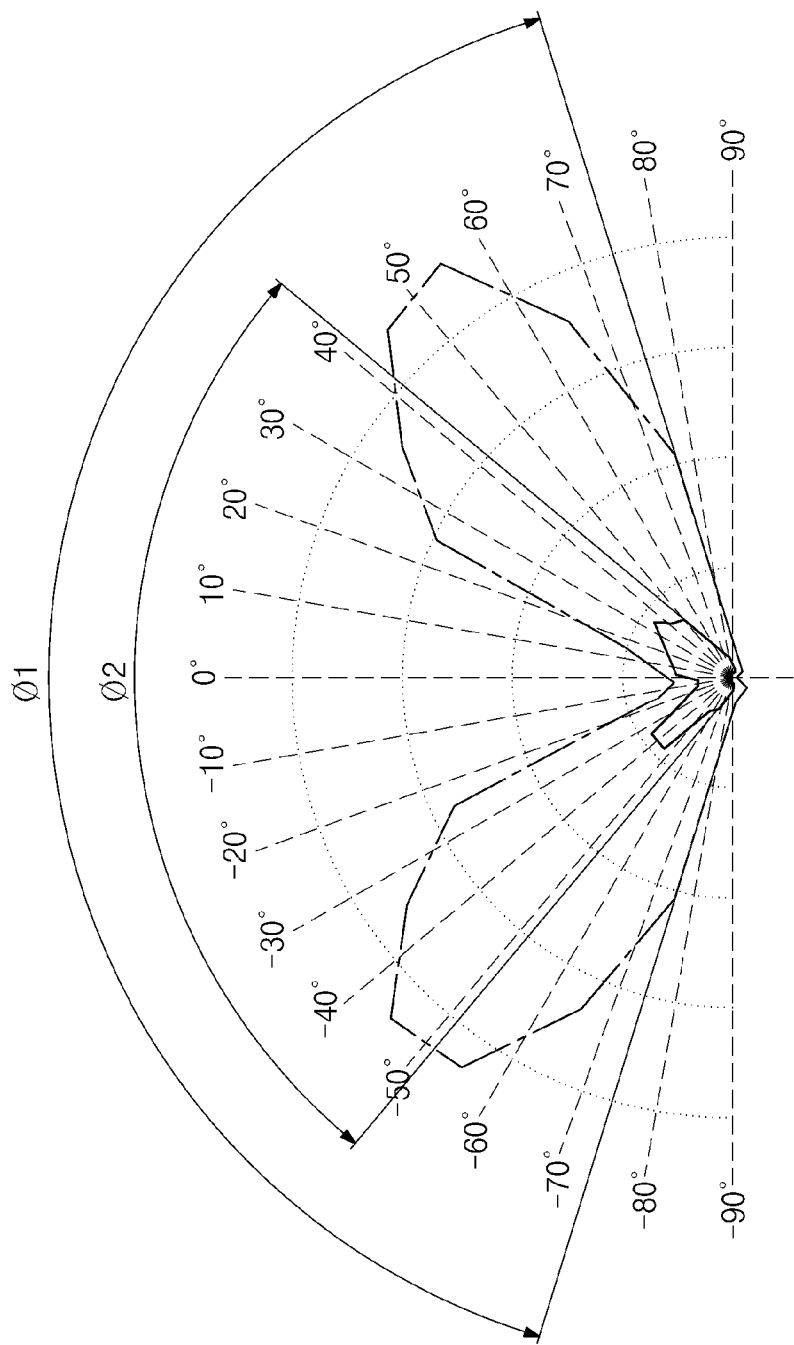
FIG. 16 is a graph showing beam-spread angles of exemplary embodiments of light emitting units according to the invention.

FIG. 16 is a graph showing beam-spread angles of exemplary embodiments of light emitting units according to the invention.

The light emitting unit 330 including the housing 332, the light emitting chip 334, and the lens 338 was manufactured as substantially illustrated in FIGS. 7 and 8. The lens 338 was formed to have the convex structure 338a with respect to the xz plane when viewed from a cross section parallel to the xy plane, and the concave structure 338b with respect to the xz plane when viewed from a cross section parallel to the yz plane.

Referring to FIG. 16, it was confirmed that the light passing through the lens 338 had the first beam-spread angle φ1 of the range of about 120 degrees to about 150 degrees in the plane parallel to the xy plane, and the second beam-spread angle φ2 of the range of about 90 degrees to about 100 degrees in the plane parallel to the yz plane.

Since the light passing through the lens 338 has the first beam-spread angle φ1 in the plane parallel to the xy plane, when the plurality of the light emitting units 330 are spaced apart from each other in the x-axis direction, it is possible to suppress generation of the hot spot.

Additionally, since the light passing through the lens 338 has the second beam-spread angle φ2 in the plane parallel to the yz plane, it is possible to increase the amount of the light irradiated to the light guide plate 320 which is disposed to be spaced apart from the light emitting unit 330 in the y-axis direction.

According to embodiments of the invention, it is possible to realize the lens irradiating the light having beam-spread angles different from each other depending on directions. Thus, light performance of the light emitting unit including the lens can be improved.

The backlight assembly including the light emitting unit may provide the light having beam-spread angles different from each other depending on directions to the light guide plate by the light emitting unit. Thus, it is possible to increase the amount of the light irradiated to the light guide plate and/or it is possible to suppress the hot spot by widening the beam-spread angles of the light emitting units.

While the invention has been described with reference to exemplary embodiments, it will be apparent to those skilled in the art that various changes and modifications may be made without departing from the spirit and scope of the invention. Therefore, it should be understood that the above embodiments are not limiting, but illustrative. Thus, the scope of the invention is to be determined by the broadest permissible interpretation of the following claims and their equivalents, and shall not be restricted or limited by the foregoing description.

What is claimed is:

1. A light emitting unit comprising:
   a housing including a bottom portion parallel to an xz plane, an opened top opposite to the bottom portion, and a singular opening defined in the bottom portion;
   a light emitting chip which is on the bottom portion and generates light;
   a first electrode and a second electrode on the bottom portion and spaced apart from each other; and
   a lens which overlaps the opened top of the housing,
   wherein the lens includes:
      a convex structure with respect to the xz plane when viewed from a cross section parallel to an xy plane, and
      a concave structure with respect to the xz plane when viewed from a cross section parallel to a yz plane,
      x, y and z being directions perpendicular to each other, respectively,
   wherein the singular opening defined in the bottom portion of the housing exposes a lower surface of both the first and second electrodes.

2. The light emitting unit of claim 1,
   wherein the light passing through the lens has a first beam-spread angle in a plane parallel to the xy plane, and a second beam-spread angle in a plane parallel to the yz plane; and
   wherein the second beam-spread angle is less than the first beam-spread angle.

3. The light emitting unit of claim 2, wherein
   the lens further includes a plurality of convex structures, and
   the plurality of convex structures is in the cross section parallel to the xy plane.

4. The light emitting unit of claim 2,
   wherein the first beam-spread angle ranges from about 120 degrees to about 150 degrees; and
   wherein the second beam-spread ranges from about degrees 90 to about 100 degrees.

5. The light emitting unit of claim 1, wherein the housing further includes sidewalls which protrude from edges of the bottom portion.

6. The light emitting unit of claim 5,
   wherein each of the sidewalls has a width which narrows from the bottom portion toward a top of each of the sidewalls; and
   wherein each of the sidewalls has an inner wall which is inclined with respect to the bottom portion and faces the light emitting chip.

7. The light emitting unit of claim 5, wherein each of the sidewalls has an inner wall which is substantially perpendicular to the bottom portion and faces the light emitting chip.

8. The light emitting unit of claim 1, wherein
   the housing further includes sidewalls which protrude from edges of the bottom portion, and an inner space between the sidewalls and the opened top,
   the light emitting chip is in the inner space, and
   the lens contacts the sidewalls and extends beyond the opened top of the inner space of the housing.

9. The light emitting unit of claim 1, further comprising:
   a connection wire which connects the light emitting chip to each of the first and second electrodes.

10. The light emitting unit of claim 9, further comprising:
    a fluorescence portion which overlaps the light emitting chip and the connection wire, wherein the fluorescence portion changes a wavelength of the light generated from the light emitting chip.

11. The light emitting unit of claim 1, further comprising:
a fluorescence portion on a top surface of the light emitting chip,
wherein the fluorescence portion has a planar area smaller than that of the top surface of the light emitting chip; and
wherein the fluorescence portion changes a wavelength of the light generated from the light emitting chip.

12. The light emitting unit of claim 1, wherein the lens includes silicon resin.

13. A backlight assembly comprising:
a supporting unit extending in an x-axis direction and having a plate-like shape;
a plurality of light emitting units on the supporting unit and spaced apart from each other in the x-axis direction, wherein the plurality of light emitting units generates light and emits the light in a y-axis direction; and
a light guide plate which is spaced apart from the plurality of light emitting units in the y-axis direction,
wherein each of the light emitting units comprises:
a housing including:
a bottom portion parallel to an xz plane, in which a singular opening is defined,
sidewalls which protrude from edges of the bottom portion, and
an inner space defined between the sidewalls,
a first electrode and a second electrode which each overlap the bottom portion of the housing, the first and second electrodes spaced apart from each other, wherein the singular opening defined in the bottom portion of the housing exposes a lower surface of the first and second electrodes,
a light emitting chip on the supporting unit; and
a lens on the light emitting chip, the lens including:
a plurality of convex structures each disposed within the inner space defined between the sidewalls with respect to the xz plane when viewed from a cross section parallel to an xy plane, and
a concave structure with respect to the xz plane when viewed from a cross section parallel to a yz plane,
x, y and z being directions perpendicular to each other, respectively.

14. The backlight assembly of claim 13,
wherein the light passing through the lens has a first beam-spread angle in a plane parallel to the xy plane, and a second beam-spread angle in a plane parallel to the yz plane; and
wherein the second beam-spread angle is less than the first beam-spread angle.

15. The backlight assembly of claim 14,
wherein the light guide plate includes an incident surface which faces the plurality of light emitting units; and
wherein the incident surface has a long side direction parallel to the x-axis direction and a thickness direction parallel to a z-axis direction.

16. The backlight assembly of claim 14,
wherein the first beam-spread angle ranges from about 120 degrees to about 150 degrees; and
wherein the second beam-spread ranges from about degrees 90 to about 100 degrees.

\* \* \* \* \*